(12) United States Patent
Nagase et al.

(10) Patent No.: US 9,385,629 B2
(45) Date of Patent: Jul. 5, 2016

(54) INVERTER DEVICE WITH UPPER AND LOWER ARM ELEMENTS

(71) Applicant: KABUSHIKI KAISHA TOYOTA JIDOSHOKKI, Kariya-shi, Aichi-ken (JP)

(72) Inventors: Toshiaki Nagase, Kariya (JP); Naohito Kanie, Kariya (JP); Nobuyuki Inayoshi, Kariya (JP)

(73) Assignee: KABUSHIKI KAISHA TOYOTA JIDOSHOKKI, Aichi-ken (JP)

( * ) Notice: Subject to any disclaimer, the term of this patent is extended or adjusted under 35 U.S.C. 154(b) by 513 days.

(21) Appl. No.: 13/938,852

(22) Filed: Jul. 10, 2013

(65) Prior Publication Data

US 2014/0015452 A1    Jan. 16, 2014

(30) Foreign Application Priority Data

Jul. 12, 2012 (JP) ................. 2012-156717

(51) Int. Cl.
*H02M 7/537* (2006.01)
*H05K 7/14* (2006.01)

(52) U.S. Cl.
CPC ............. *H02M 7/537* (2013.01); *H05K 7/1432* (2013.01)

(58) Field of Classification Search
CPC ..................................................... H02M 7/537
See application file for complete search history.

(56) References Cited

U.S. PATENT DOCUMENTS

| | | | | |
|---|---|---|---|---|
| 6,884,953 B2* | 4/2005 | Nii | ......... | H02M 7/003 174/149 B |
| 7,760,503 B2* | 7/2010 | Aoki | ......... | H01L 23/473 165/104.3 |
| 7,965,510 B2* | 6/2011 | Suzuki | ......... | B60K 6/365 165/80.4 |
| 2009/0040724 A1 | 2/2009 | Nishikimi et al. | | |
| 2012/0039039 A1 | 2/2012 | Nishikimi et al. | | |
| 2012/0170217 A1 | 7/2012 | Nishikimi et al. | | |
| 2014/0016387 A1 | 1/2014 | Nishikimi et al. | | |
| 2015/0055386 A1 | 2/2015 | Nishikimi et al. | | |

FOREIGN PATENT DOCUMENTS

| | | |
|---|---|---|
| CN | 101409515 A | 4/2009 |
| CN | 201532949 U | 7/2010 |
| JP | 1-194344 A | 8/1989 |
| JP | 3173511 U | 2/2012 |
| JP | 3173512 U | 2/2012 |

OTHER PUBLICATIONS

Communication dated May 6, 2015 from the State Intellectual Property Office of the P.R.C. In counterpart application No. 201310284509.9.

* cited by examiner

*Primary Examiner* — Emily P Pham
(74) *Attorney, Agent, or Firm* — Sughrue Mion, PLLC

(57) ABSTRACT

An inverter device includes a substrate, upper arm elements, lower arm elements, positive and negative input electrodes, and an output electrode. The upper arm elements serve as an upper switching element and are arranged along a first direction. The lower arm elements serve as a lower arm switching element and are arranged along the first direction. At least one of bus bars of the positive and negative input electrodes and the output electrode extends parallel to the first direction. At least one of the bus bars of the positive and negative input electrodes and the output electrode has a length in the longitudinal direction that is greater than a width between two ends of the upper arm elements and the lower arm elements in the first direction.

4 Claims, 6 Drawing Sheets

INVERTER DEVICE WITH UPPER AND LOWER ARM ELEMENTS

BACKGROUND OF THE INVENTION

The present invention relates to an inverter device including upper and lower arm switching elements, each provided with a plurality of power elements connected in parallel, electrodes, and a substrate, on which the power elements and the electrode are mounted.

Japanese Registered Utility Model No. 3173511 discloses a semiconductor device (inverter). Upper and lower arms each include an element group formed by a plurality of parallel-connected elements. The element groups are for U, V, and W phases and arranged on a main circuit substrate. Positive and negative input electrodes and output terminals for U, V, and W are arranged on the main circuit substrate.

Referring to FIG. 7, element groups G1 to G6, which form the upper and lower arm switching elements, are arranged on a main circuit substrate 200 between a positive input electrode bus bar 201a and a negative input electrode bus bar 202a. Output electrode bus bars 203, 204, and 205, a positive relay electrode 201b, and a negative relay electrode 202b are arranged between adjacent ones of the element groups G1 to G6, which form the upper and lower arms. The input electrode bus bars 201a and 202a, the relay electrodes 201b and 202b, and the output electrode bus bars 203, 204, and 205 each have a length in the longitudinal direction that is shorter than each of the element groups G1 to G6. Current flowing through power elements has a tendency of flowing to an output electrode through the shortest path. The power element that is far from a terminal connection portion of an output electrode in each element group is separated by a long distance from the bus bar and the relay electrode. This lengthens the current path. Thus, the lengthened current path increases the inductance from the power element arranged at the end of each element group to the bus bar and the relay electrode.

SUMMARY OF THE INVENTION

It is an object of the present invention to provide an inverter device that decreases wire inductance between an input electrode or an output electrode and an element group on a substrate.

To achieve the above object, one aspect of the present invention is an inverter device for converting power. The inverter device includes a substrate, an upper arm group, a lower arm group, positive and negative input electrodes, and an output electrode. The upper arm group includes a plurality of upper arm elements and serves as an upper arm switching element. The upper arm elements are arranged on the substrate in a single line along a first direction and connected in parallel to each other. The lower arm group includes a plurality of lower arm elements and serves as a lower arm switching element. The lower arm elements are arranged on the substrate in a single line along the first direction and connected in parallel to each other. The positive and negative input electrodes sandwich the upper and lower arm groups on the substrate. Each of the positive and negative electrodes includes a terminal and a bus bar. The output electrode is sandwiched between the upper arm group and the lower arm group on the substrate. The output electrode includes a terminal and a bus bar. At least one of the bus bars of the positive and negative input electrodes and the output electrode extends so that a longitudinal direction of the bus bar is parallel to the first direction. At least one of the bus bars of the positive and negative input electrodes and the output electrode has a length in the longitudinal direction that is greater than a width between two ends of the upper arm elements and the lower arm elements in the first direction.

Other aspects and advantages of the present invention will become apparent from the following description, taken in conjunction with the accompanying drawings, illustrating by way of example the principles of the invention.

BRIEF DESCRIPTION OF THE DRAWINGS

The invention, together with objects and advantages thereof, may best be understood by reference to the following description of the presently preferred embodiments together with the accompanying drawings in which.

DETAILED DESCRIPTION OF THE INVENTION

Figure 1:
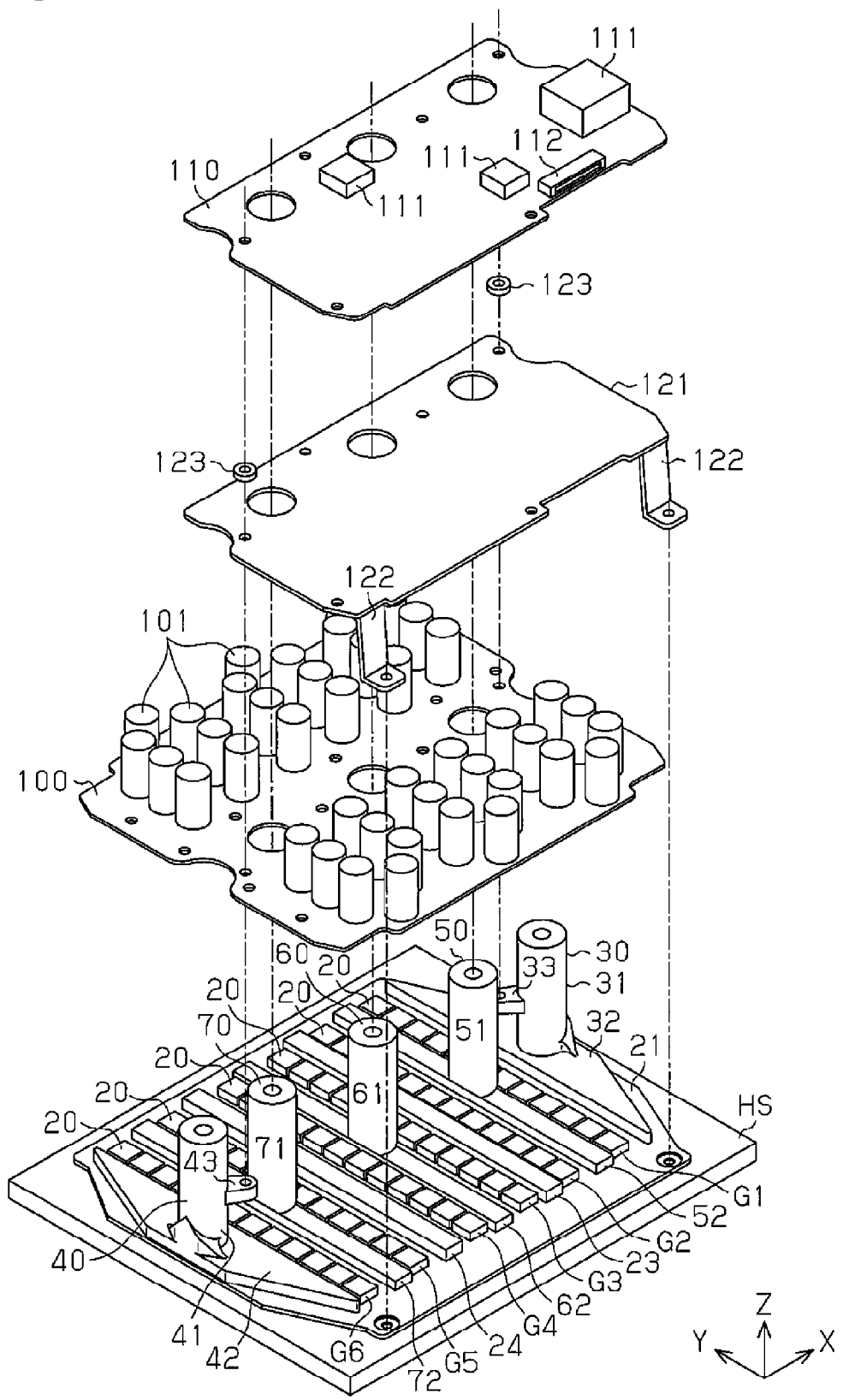
FIG. 1 is an exploded perspective view showing an inverter device according to one embodiment of the present invention.

An inverter device 10 according to one embodiment of the present invention will now be described with reference to FIGS. 1 to 6. The inverter device 10 is installed in a vehicle.

As viewed in the drawings, X and Y directions extend horizontally, and a Z direction extends vertically.

Figure 2:
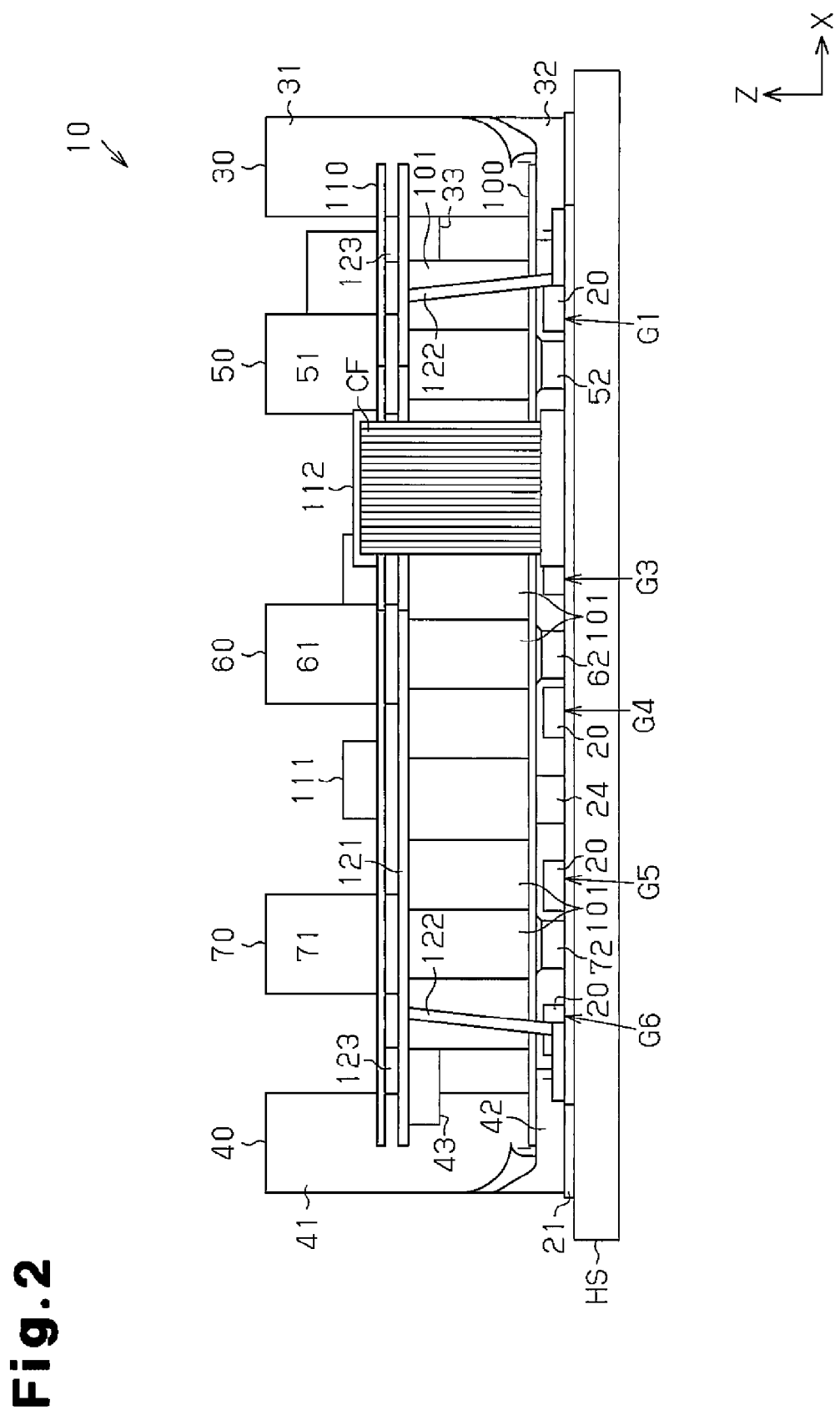
FIG. 2 is a front view showing the inverter device of FIG. 1.

Referring to FIGS. 1 and 2, a flat and thin heat sink HS includes a horizontal upper surface. A main circuit substrate 21 is arranged on the heat sink HS. A capacitor substrate 100 is arranged to oppose the main circuit substrate 21 above the main circuit substrate 21. Further, a plate-shaped auxiliary bracket 121 is arranged above and opposed to the capacitor substrate 100. A control circuit substrate 110 is arranged above and opposed to the auxiliary bracket 121.

A plurality of power elements 20, a positive input electrode 30, a negative input electrode 40, a U phase output electrode 50, a V phase output electrode 60, a W phase output electrode 70, and the like are arranged on the main circuit substrate 21. A plurality of capacitors 101 are arranged on the capacitor substrate 100. Various types of electronic components 111 are arranged on the control circuit substrate 110. Further, conductive collars 123 are arranged between the auxiliary bracket 121 and the control circuit substrate 110.

Figure 3:
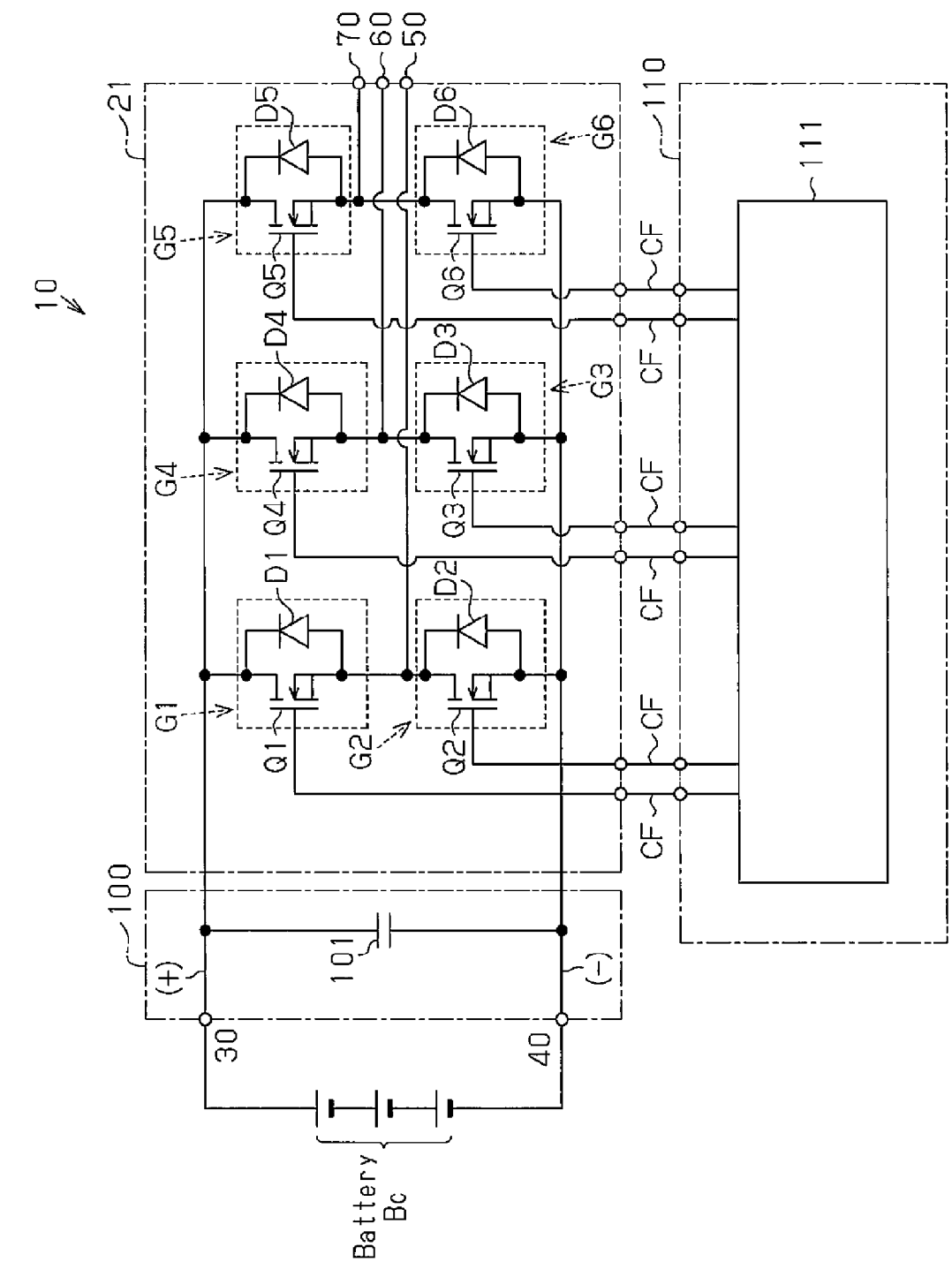
FIG. 3 is a circuit diagram of the inverter device of FIG. 1.

Referring to FIG. 3, the inverter device 10 of the present embodiment is a three-phase inverter that supplies a motor with three-phase AC power and converts DC power, which is supplied from a battery, to AC power. As shown in FIG. 3, the inverter device 10 includes a U phase upper arm switching element Q1 and a U phase lower arm switching element Q2. The two switching elements Q1 and Q2 are connected in series with each other. Further, the inverter device 10 includes a V phase upper arm switching element Q3 and a V phase lower arm switching element Q4. The two switching elements Q3 and Q4 are connected in series. Moreover, the inverter device 10 includes a W phase upper arm switching element Q5 and a W phase lower arm switching element Q6. The two switching elements Q5 and Q6 are connected in series. Diodes D1, D2, D3, D4, D5, and D6 are connected in parallel to the switching elements Q1, Q2, Q3, Q4, Q5, and Q6, respectively. The switching elements Q1 to Q6 and the diodes D1 to D6 are mounted on the main circuit substrate 21.

Figure 4:
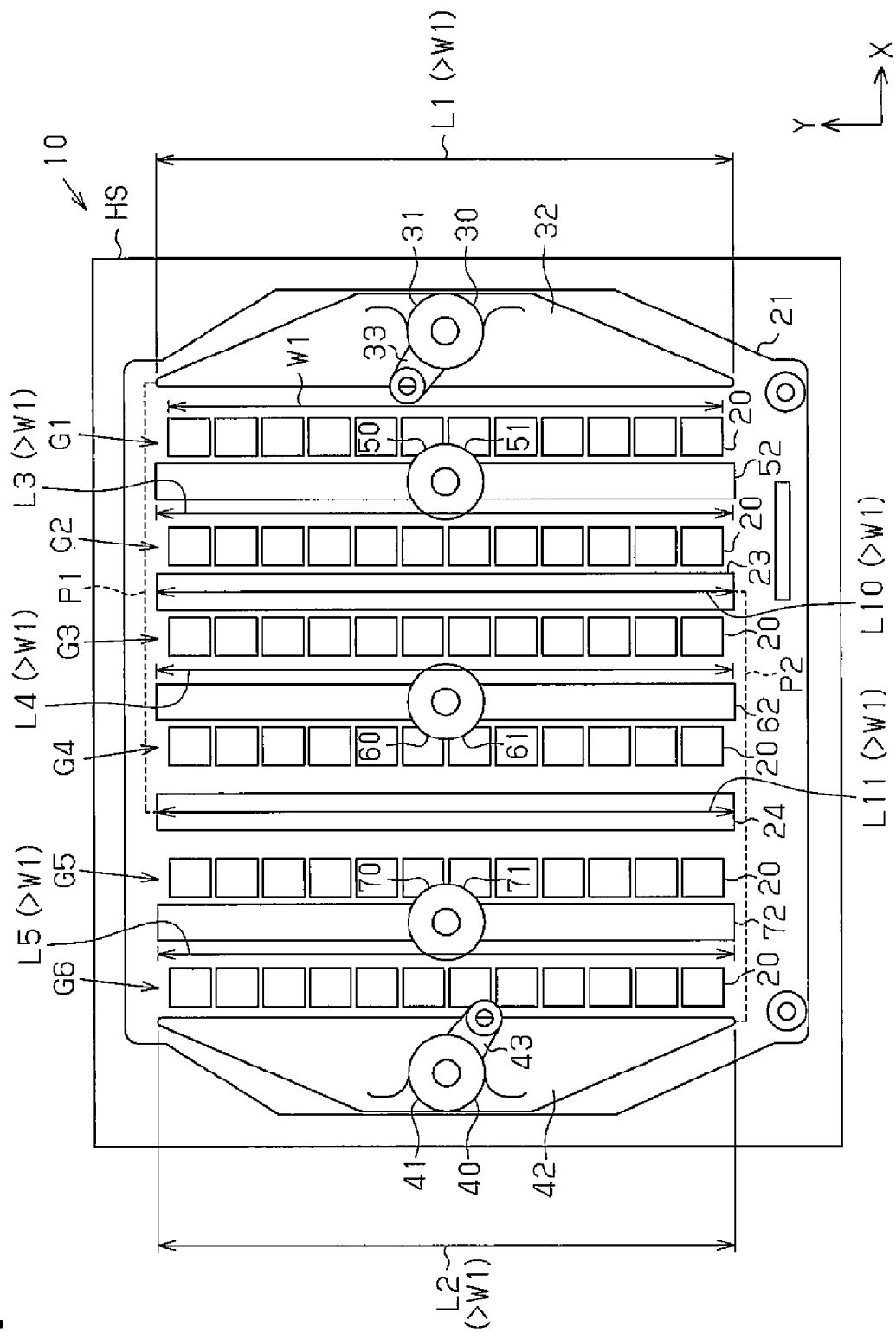
FIG. 4 is a plan view showing a main circuit substrate.

Referring to FIGS. 1 and 4, the upper arm switching element Q1 includes a plurality of first power elements 20, which form the first element group G1. The first power elements 20 are arranged on the main circuit substrate 21 in a single line along a single direction (Y direction) and connected in parallel to one another. In detail, each of the first power elements 20 is a chip including a diode and a switching element that are connected in parallel to each other, and the first power element 20 is mounted on the main circuit substrate 21. A MOSFET is used as each of the switching elements. In the same manner, the lower arm switching element Q2 includes a plurality of second power elements 20, which form the second element group G2. The second power elements 20 are arranged on the main circuit substrate 21 in a single line along a single direction (Y direction) and connected in parallel to one another. The lower arm switching element Q3 includes a plurality of third power elements 20, which form the third element group G3. The third power elements 20 are arranged on the main circuit substrate 21 in a single line along a single direction (Y direction) and connected in parallel to one another. The upper arm switching element Q4 includes a plurality of fourth power elements 20, which form the fourth element group G4. The fourth power elements 20 are arranged on the main circuit substrate 21 in a single line along a single direction (Y direction) and connected in parallel to one another. The upper arm switching element Q5 includes a plurality of fifth power elements 20, which form the fifth element group G5. The fifth power elements 20 are arranged on the main circuit substrate 21 in a single line along a single direction (Y direction) and connected in parallel to one another. The lower arm switching element Q6 includes a plurality of sixth power elements 20, which form the sixth element group G6. The sixth power elements 20 are arranged on the main circuit substrate 21 in a single line along a single direction (Y direction) and connected in parallel to one another.

The first power elements 20, the fourth power elements 20, and the fifth power elements 20 each serve as upper arm elements. The first element group G1, the fourth element group G4, and the fifth element group G5 each serves as an upper arm group. The second power elements 20, the third power elements 20, and the sixth power elements 20 each serve as lower arm elements. The second element group G2, the third element group G3, and the sixth element group G6 each serves as a lower arm group.

In this manner, the upper switching elements Q1, Q4, and Q5 and the lower switching elements Q2, Q3, and Q6 each include the power elements 20 that form the corresponding element groups G1 to G6. The first to sixth power elements 20 of each of the switching elements Q1 to Q6 are arranged in lines along the same direction (Y direction) and connected in parallel to one another. A plurality of the power elements 20 are mounted on the main circuit board in FIGS. 1 and 4 but are shown in an equivalent manner in FIG. 3 to facilitate illustration.

In FIG. 3, the U phase output electrode 50 is connected to a connection node between the U phase upper arm switching element Q1 and the lower arm switching element Q2. The V phase output electrode 60 is connected to a connection node between the V phase upper arm switching element Q4 and the lower arm switching element Q3. The W phase output electrode 70 is connected to a connection node between the W phase upper arm switching element Q5 and the lower arm switching element Q6. The U phase output electrode 50, the V phase output electrode 60, and the W phase output electrode 70 are connected to a vehicle travel motor (not shown), which serves as an output device.

In the main circuit substrate 21 shown in FIG. 4, the drain of the switching element Q1 (first element group G1) is electrically connected to the positive input electrode 30 by a conductive pattern (not shown). A plurality of conductive patterns are formed on the main circuit substrate 21. The drains of the switching elements Q4 and Q5 (fourth element group G4 and fifth element group G5) are electrically connected to the positive relay electrode 24 by conductive patterns (not shown), and the positive relay electrode 24 is electrically connected to the positive input electrode 30 by a conductive pattern P1 (refer to FIG. 4). The sources of the switching elements Q2 and Q3 (second element group G2 and third element group G3) are electrically connected to the negative relay electrode 23 by conductive patterns (not shown), and the negative relay electrode 23 is electrically connected to the negative input electrode 40 by a conductive pattern P2 (refer to FIG. 4). The source of the switching element Q6 (sixth element group G6) is electrically connected to the negative input electrode 40 by a conductive pattern (not shown).

Referring to FIG. 3, a plurality of capacitors 101 are connected in parallel between the positive input electrode 30 and the negative input electrode 40. The capacitors 101 are mounted on the capacitor substrate 100.

Referring to FIGS. 1 and 4, the positive and negative input electrodes 30 and 40 sandwich the element groups G1 to G6 on the main circuit substrate 21 so as to. Further, the output electrodes 50, 60, and 70 are sandwiched by the element groups G1 to G6 on the main circuit substrate 21.

In detail, the first element group G1, the second element group G2, the third element group G3, the fourth element group G4, the fifth element group G5, and the sixth element group G6 are arranged in order from right to left in the X direction. The positive input electrode 30 is arranged at the rightmost side in the X direction, and the negative input electrode 40 is arranged at the leftmost side in the X direction. The U phase output electrode 50 is arranged between the first element group G1 and the second element group G2 in the X direction. The V phase output electrode 60 is arranged between the third element group G3 and the fourth element group G4 in the X direction. The W phase output electrode 70 is arranged between the fifth element group G5 and the sixth element group G6 in the X direction.

The relay electrodes 23 and 24 are sandwiched between the element groups G2, G3, G4, and G5 on the main circuit substrate 21. In detail, the negative relay electrode 23 is arranged between the second element group G2 and the third element group G3 in the X direction, and the negative relay electrode 23 is electrically connected to the negative input electrode 40 by the conductive pattern P2, as described above. The positive relay electrode 24 is arranged between the fourth element group G4 and the fifth element group G5 in the X direction, and the positive relay electrode 24 is electrically connected to the positive input electrode 30 by the conductive pattern P1, as described above.

Referring to FIG. 3, the capacitors 101 connect the positive input electrode 30 and the negative input electrode 40 of the inverter device 10 to a positive terminal and a negative terminal of a vehicle battery Bc. The gates of the switching elements Q1 to Q6 are connected to the electronic components 111 of a control circuit through flat cables CF that connect the main circuit substrate 21 and the control circuit substrate 110. The electronic components 111 of the control circuit are mounted on the control circuit substrate 110 (refer to FIGS. 1 and 2). The inverter device 10 is configured so that the control circuit of the control circuit substrate 110 switch-controls the switching elements Q1 to Q6 to supply the vehicle travel motor with power.

Referring to FIGS. 1 and 4, the positive and negative input electrodes 30 and 40, which are formed from aluminum, and the U, V, and W phase output electrodes 50, 60, and 70, which are formed from aluminum, include terminals 31, 41, 51, 61, and 71 and bus bars (narrow plates) 32, 42, 52, 62, and 72, respectively. The terminals 31, 41, 51, 61, and 71 are generally rod-shaped. The bus bars 32, 42, 52, 62, and 72 are arranged on conductive patterns of the main circuit substrate 21.

The bus bars 32, 42, 52, 62, and 72 are formed by elongated plates that are tetragonal and narrow. Further, the bus bars 32, 42, 52, 62, and 72 are electrically connected to the conductive patterns in planar contact with the conductive patterns. The rod-shaped terminals 31, 41, 51, 61, and 71 of the input electrodes 30 and 40 and the output electrodes 50, 60, and 70 are arranged at longitudinally middle sections of the bus bars 32, 42, 52, 62, and 72.

The bus bars 32, 42, 52, 62, and 72 are arranged on the main circuit substrate 21 so that their longitudinal directions are parallel to the direction in which the power elements 20 are arranged (Y direction) in the element groups G1 to G6. The bus bar 32 has a length L1 in the longitudinal direction (Y direction) that is greater than the width W1 between the two ends of each of the element groups G1 to G6 in the direction the power elements 20 are arranged. In the same manner, the bus bar 42 has a length L2 in the longitudinal direction (Y direction) that is greater than the width W1 between the two ends of each of the element groups G1 to G6 in the direction the power elements 20 are arranged. The bus bar 52 has a length L3 in the longitudinal direction (Y direction) that is greater than the width W1 between the two ends of each of the element groups G1 to G6 in the direction the power elements 20 are arranged. The bus bar 62 has a length L4 in the longitudinal direction (Y direction) that is greater than the width W1 between the two ends of each of the element groups G1 to G6 in the direction the power elements 20 are arranged. The bus bar 72 has a length L5 in the longitudinal direction (Y direction) that is greater than the width W1 between the two ends of each of the element groups G1 to G6 in the direction the power elements 20 are arranged.

In this manner, the bus bars 32, 42, 52, 62, and 72 of the electrodes 30, 40, 50, 60, and 70 on the main circuit substrate 21 have lengths (Y direction lengths L1, L2, L3, L4, and L5) that are greater than the width W1 between the two ends of each of the element groups G1 to G6 in the direction the power elements 20 are arranged.

The negative relay electrode 23 is arranged on the main circuit substrate 21 so that its longitudinal direction is parallel to the direction in which the power elements 20 are arranged (Y direction) in the element groups G1 to G6. Further, the positive relay electrode 24 is arranged on the main circuit substrate 21 so that its longitudinal direction is parallel to the direction in which the power elements 20 are arranged (Y direction) in the element groups G1 to G6. The negative relay electrode 23 has a length L10 in the longitudinal direction (Y direction) that is greater than the width W1 between the two ends of each of the element groups G1 to G6 in the direction the power elements 20 are arranged (Y direction).

Referring to FIGS. 1 and 2, the capacitor substrate 100 is arranged on upper surfaces of the bus bars 32 and 42 for the positive and negative input electrodes 30 and 40. The bus bars 32 and 42 electrically connect the positive input electrode 30 and the negative input electrode 40 to the capacitor substrate 100. Further, the positive and negative input electrodes 30 and 40 include control circuit substrate supports 33 and 43 projecting from upper circumferential surfaces of the rod-shaped terminals 31 and 41, respectively.

The rod-shaped terminals 51, 61, 71 of the U phase output electrode 50, the V phase output electrode 60, and the W phase output electrode 70 extend through the capacitor substrate 100. The auxiliary bracket 121 includes two legs 122 fixed to the main circuit substrate 21 so that the auxiliary bracket 121 is located above the main circuit substrate 21. The control circuit substrate supports 33 and 43 of the positive and negative input electrodes 30 and 40 support the auxiliary bracket 121. Further, the terminals 51, 61, and 71 of the U phase output electrode 50, the V phase output electrode 60, and the W phase output electrode 70 extend through the auxiliary bracket 121. The control circuit substrate 110 is supported on the auxiliary bracket 121. Further, the terminals 51, 61, and 71 of the U phase output electrode 50, the V phase output electrode 60, and the W phase output electrode 70 extend through the control circuit substrate 110. The conductive collars 123 electrically connect the control circuit substrate supports 33 and 43 to the control circuit substrate 110. A control circuit connector 112 is arranged on the control circuit substrate 110 and connected to a flat cable CF. The flat cable CF serves as a connection member and electrically connects the main circuit substrate 21 and the control circuit substrate 110.

The operation of the inverter device will now be described.

Direct current from the vehicle battery Bc flows to the main circuit substrate 21 via the input electrodes 30 and 40 and the relay electrodes 23 and 24. The upper arm switching elements Q1, Q4, and Q5 (power elements 20 of first, fourth, and fifth element groups G1, G4, and G5) and the lower arm switching elements Q2, Q3, and Q6 (power elements 20 of second, third, and sixth element groups G3, G3, and G6) undergo on-off control. Alternating current flows via the U phase output electrode 50, the V phase output electrode 60, and the W phase output electrode 70 to the vehicle travel motor.

When the positive input electrode 30 and the negative input electrode 40 are heated, heat is transmitted from the bus bars 32 and 42 via the main circuit substrate 21 to the heat sink HS, which radiates the heat. Further, the heat generated by the switching operation of the switching elements Q1 to Q6 (element groups G1 to G6) is transmitted via the main circuit substrate 21 to the heat sink HS, which radiates the heat.

The flow of current in the main circuit substrate 21 when the switching elements Q1 to Q6 (element groups G1 to G6) are activated and deactivated will now be described.

Direct current from the vehicle battery Bc is supplied to the inverter device 10. Then, the control circuit (electronic components 111) activates and deactivates the switching elements Q1 to Q6 (element groups G1 to G6) and output alternating current from the output electrodes 50, 60, and 70.

As shown in FIG. 4, the lengths L1, L2, L3, L4, and L5 of the bus bars 32, 42, 52, 62, and 72 in the longitudinal direction are greater than the width W1 between the two ends of each of the element groups G1 to G6 in the direction the power elements 20 are arranged. As a result, bus bars allowing for efficient flow of current and including a larger current path than copper patterns formed on a substrate are arranged closer to the ones of the power elements connected in parallel that are arranged at the side farther from the output electrode. This allows for reduction in inductance entirely in the element group for each phase. More specifically, in FIG. 7, with regard to the relationship of dimension L50 of the positive electrode, dimension L51 of the negative electrode, and dimension W50 of the element groups G1 to G6, the dimensions L50 and L51 of the electrodes are smaller than the dimension W50 of the element groups. In this case, wire inductance is apt to increasing. The same applies to the bus bars 203, 204, and 205 for each of the phases. In contrast, in the present embodiment shown in FIG. 4, the lengths L1, L2, L3, L4, and L5 of the bus bars 32, 42, 52, 62, and 72 is greater than the width W1 between the two ends of each of the element groups G1 to G6 in the direction the power elements 20 are arranged. This reduces the wire inductance.

This will be described in further detail with reference to FIG. 5.

Figure 5:
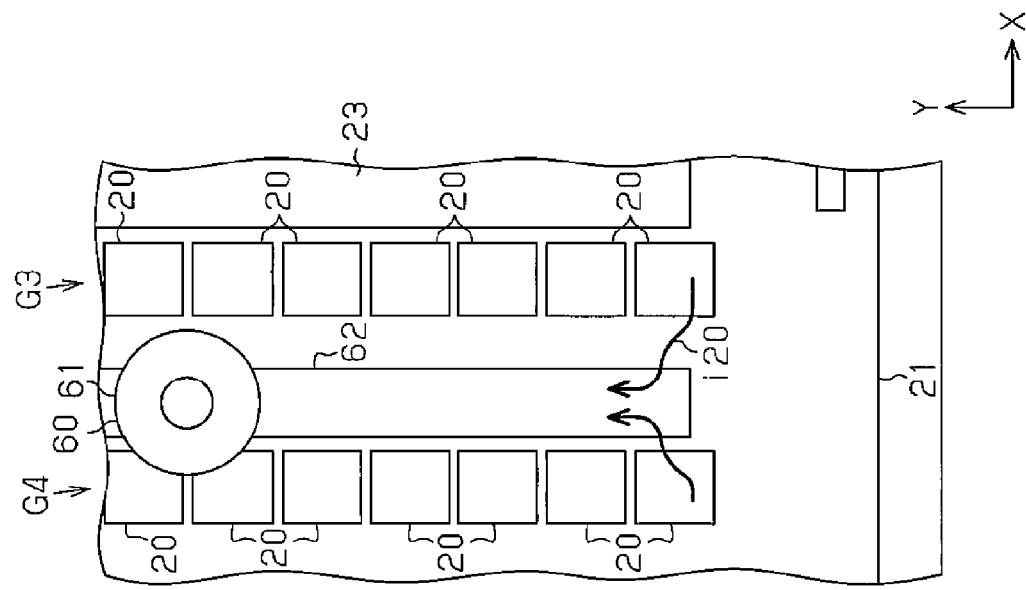
FIG. 5 is a partial schematic plan view showing the main circuit substrate of FIG. 4.
Figure 6:
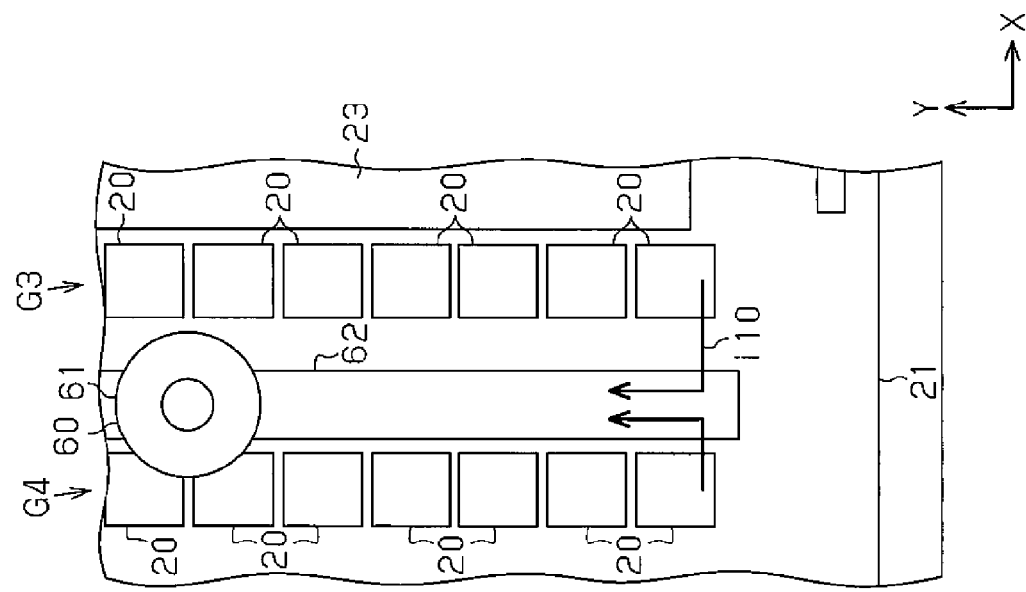
FIG. 6 is a partial schematic plan view showing a main circuit substrate of an inverter device in a comparative example.

FIG. 5 illustrates the present embodiment and corresponds to FIG. 4.

Figure 7:
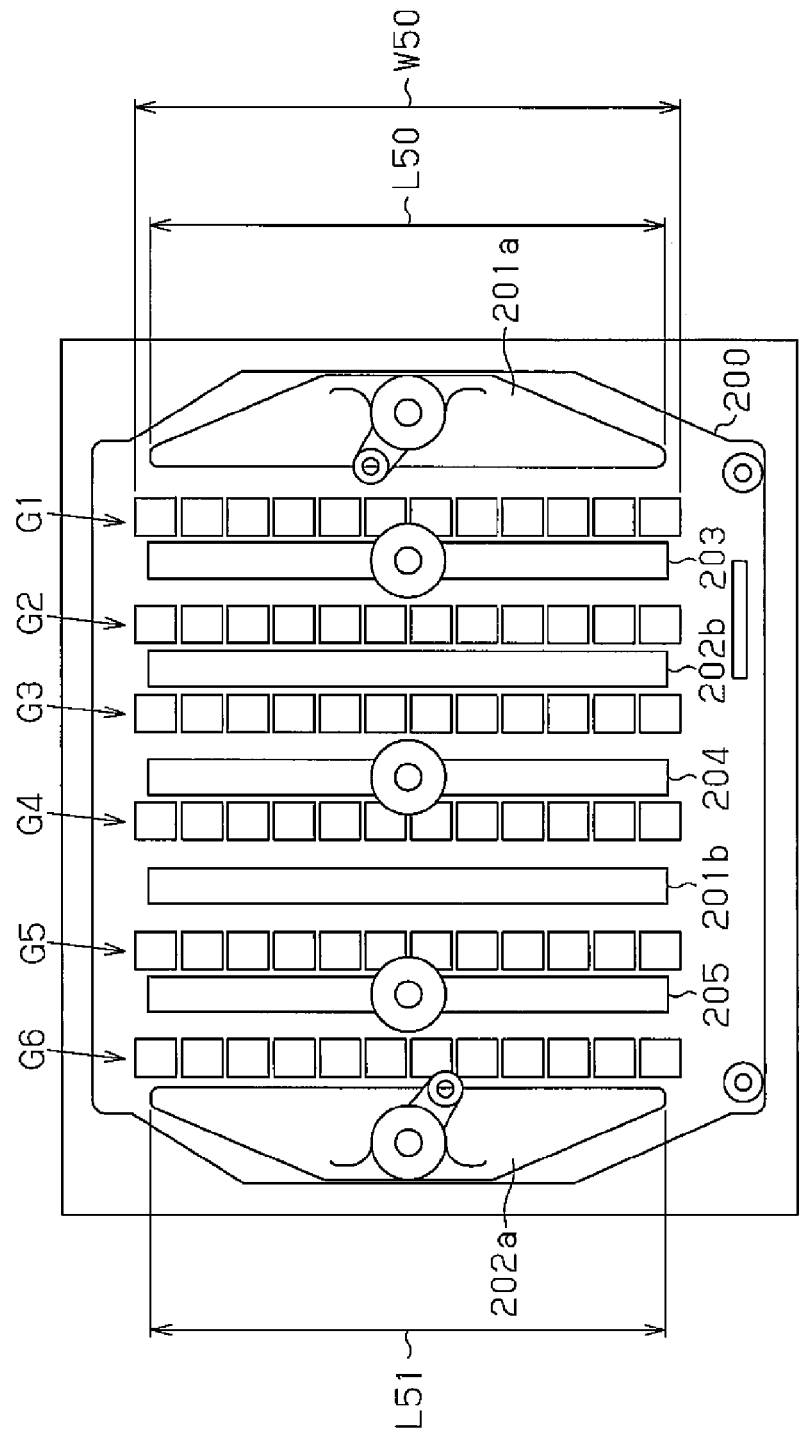
FIG. 7 is a plan view showing the prior art.

A case in which the dimensions L50 and L51 of the electrodes is smaller than the dimension W50 of the element groups as shown in FIG. 7 will now be described. Current i20 flows to the output electrode from the power elements 20 arranged in a single line and in a single direction on the main circuit substrate 21. Here, as for the power elements 20 located at the ends, referring to FIG. 6, current flows through a diagonal path toward the bus bar that is electrically connected to the output electrode. The same applies to the other phases of FIG. 7.

Further, the case of FIG. 4 in which the lengths L1, L2, L3, L4, and L5 of the bus bars 32, 42, 52, 62, and 72 are greater than the width W1 between the two ends of each of the element groups G1 to G6 in the direction the power elements 20 are arranged will now be described. Current i10 flows to the output electrode from the power elements 20 arranged in a single line and in a single direction on the main circuit substrate 21. Here, as for the power elements 20 located at the ends, referring to FIG. 5, current flows straight aside through the shortest path toward the bus bar electrically connected to the output electrode.

Thus, in contrast with when the dimension W50 of the element groups G1 to G6 is smaller than the dimensions L50 and L51 of the electrodes (bus bars 201 and 202) as shown FIG. 7, when the lengths L1, L2, L3, L4, and L5 of the bus bars 32, 42, 52, 62, and 72 is greater than the width W1 between the two ends of each of the element groups G1 to G6 in the direction the power elements 20 are arranged, the wire inductance may be reduced. By further shortening the current path when upper arm current is commutated to lower arm current, inductance may be reduced. Further, the current flowing through each of the power elements 20 in the element groups G1 to G6 may be balanced. As a result, when switching the power elements 20 at the same switching speed as the prior art, a switching surge voltage may be decreased. Consequently, inexpensive power elements designed for lower voltages may be employed.

Even when increasing the switching speed, the switching surge voltage would be about the same as the prior art. Thus, switching loss may be reduced. Consequently, a compact and inexpensive cooling system (heat sink HS) may be used.

The same applies to the relay electrode 23 and 24. More specifically, the lengths L10 and L11 of the relay electrodes 23 and 24 in the longitudinal direction is greater than the width W1 between the two ends of each of the element groups G1 to G6 in the direction the power elements 20 are arranged. Thus, as described with reference to FIGS. 5 and 6, wire inductance is reduced between the relay electrodes 23 and 24 and the element groups G2 to G5.

The present embodiment has the advantages described below.

(1) The bus bars 32, 42, 52, 62, and 72 are arranged on the main circuit substrate 21 so that their longitudinal directions is parallel to the direction in which the power elements 20 are arranged in each of the element groups G1 to G6. The lengths L1, L2, L3, L4, and L5 of the bus bars 32, 42, 52, 62, and 72 in the longitudinal direction is greater than the width W1 between the two ends of each of the element groups G1 to G6 in the direction the power elements 20 are arranged. Thus, the wire inductance may be reduced on the main circuit substrate 21 between the element groups G1 to G6 and the input electrodes 30 and 40 and the output electrodes 50, 60, and 70.

(2) The element groups G2, G3, G4, and G5 sandwich the relay electrodes 23 and 24, which are connected by the input electrodes 30 and 40 and the conductive patterns P1 and P2, on the main circuit substrate 21. The relay electrodes 23 and 24 are arranged on the main circuit substrate 21 so that their longitudinal directions are parallel to the direction in which the power elements 20 of the element groups G1 to G6 are arranged. The lengths L10 and L11 in the longitudinal direction of the relay electrodes 23 and 24 is greater than the width W1 between the two ends of each of the element groups G1 to G6 in the direction the power elements 20 are arranged. Thus, the wire inductance may be reduced between the relay electrodes 23 and 24 and the elements groups G2 to G5 on the main circuit substrate 21.

It should be apparent to those skilled in the art that the present invention may be embodied in many other specific forms without departing from the spirit or scope of the invention. Therefore, the present examples and embodiments are to be considered as illustrative and not restrictive, and the invention is not to be limited to the details given herein, but may be modified within the scope and equivalence of the appended claims.

The invention claimed is:

1. An inverter device for converting power, the inverter device comprising:
   a substrate;
   an upper arm group including a plurality of upper arm elements and serving as an upper arm switching element, wherein the upper arm elements are arranged on the substrate in a single line along a first direction and connected in parallel to each other,
   a lower arm group including a plurality of lower arm elements and serving as a lower arm switching element, wherein the lower arm elements are arranged on the substrate in a single line along the first direction and connected in parallel to each other;
   positive and negative input electrodes sandwiching the upper and lower arm groups on the substrate, wherein each of the positive and negative electrodes includes a terminal and a bus bar; and
   an output electrode sandwiched between the upper arm group and the lower arm group on the substrate, wherein the output electrode includes a terminal and a bus bar, wherein
   at least one of the bus bars of the positive and negative input electrodes and the output electrode extends so that a longitudinal direction of the bus bar is parallel to the first direction, and
   at least one of the bus bars of the positive and negative input electrodes and the output electrode has a length in the longitudinal direction that is greater than a width between two ends of the upper arm elements and the lower arm elements in the first direction.

2. The inverter device according to claim 1, further comprising a relay electrode connected to the input electrode by a conductive pattern formed on the substrate, wherein
   the relay electrode is sandwiched between the upper arm group and the lower arm group on the substrate,
   the relay electrode extends so that a longitudinal direction of the relay electrode is parallel to the first direction, and the relay electrode has a length in the longitudinal direction that is greater than the width between the two ends of the upper arm elements and the lower arm elements in the first direction.

3. The inverter device according to claim 1, wherein the inverter device is a three-phase inverter that supplies three-phase AC power to a motor.

4. The inverter device according to claim 1, wherein each of the bus bars of the positive and negative input electrodes and the output electrodes extends so that a longitudinal direction of the bus bar is parallel to the first direction, and each of the bus bars of the positive and negative input electrodes and the output electrodes has a length in the longitudinal direction that is greater than the width between the two ends of the upper arm elements and the lower arm elements in the first direction.

\* \* \* \* \*